United States Patent
Pei et al.

(10) Patent No.: US 8,299,573 B2
(45) Date of Patent: Oct. 30, 2012

(54) TRENCH CAPACITOR

(75) Inventors: Chengwen Pei, Hopewell Junction, NY (US); Xi Li, Hopewell Junction, NY (US); Geng Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 12/818,448

(22) Filed: Jun. 18, 2010

(65) Prior Publication Data
US 2011/0309474 A1 Dec. 22, 2011

(51) Int. Cl.
*H01L 21/02* (2006.01)
(52) U.S. Cl. ............... 257/532; 257/E29.342; 438/386; 438/389
(58) Field of Classification Search .......... 257/532, 257/E29.342; 438/386, 389
See application file for complete search history.

(56) References Cited

U.S. PATENT DOCUMENTS

| 4,475,982 | A | 10/1984 | Lai et al. |
| 4,889,492 | A | 12/1989 | Barden et al. |
| 5,538,592 | A | 7/1996 | Chen et al. |
| 6,645,854 | B1 | 11/2003 | Hopper |
| 6,876,026 | B2 | 4/2005 | Hierlemann et al. |
| 7,666,738 | B2 | 2/2010 | Shin et al. |
| 2003/0222296 | A1* | 12/2003 | Kumar et al. ............ 257/301 |
| 2006/0172486 | A1 | 8/2006 | Tews et al. |

OTHER PUBLICATIONS

R.H. Dennard; CMOS Semiconductor Memory Structural Modification to Allow Increased Memory Charge; IP.com, IPCOM000034737D; Apr. 1, 1989.

* cited by examiner

*Primary Examiner* — Stephen W Smoot
*Assistant Examiner* — Vicki B Booker
(74) *Attorney, Agent, or Firm* — Joseph P. Abate; Howard M. Cohn

(57) ABSTRACT

A trench and method of fabrication is disclosed. The trench shape is cylindrosymmetric, and is created by forming a dopant profile that is monotonically increasing in dopant concentration level as a function of depth into the substrate. A dopant sensitive etch is then performed, resulting in a trench shape providing increased surface area, yet having relatively smooth trench walls.

20 Claims, 5 Drawing Sheets

TRENCH CAPACITOR

FIELD OF THE INVENTION

The present invention relates generally to a semiconductor fabrication. More specifically, the present invention relates to trench structures, and fabrication methods for trench structures.

BACKGROUND OF THE INVENTION

A trench capacitor is a common element in various semiconductor devices, such as DRAM devices, for example. Dynamic random-access memory (DRAM) cells are composed of two main components, a storage capacitor that is used to store electronic charge and an access transistor that is used to transfer the electronic charge to and from the storage capacitor.

The storage capacitor may be either planar on the surface of the semiconductor substrate or trench etched into the semiconductor substrate. In the semiconductor industry where there is an increased demand for memory storage capacity accompanied with an ever decreasing chip size, the trench storage capacitor layout is favored over the planar type, and is the prevailing design choice today.

As consumers are demanding products with more processing power, and smaller physical size, there is a need to improve the performance of various integrated circuits, such as DRAM devices. Therefore, it is needed to have an improved trench structure that is highly scalable, while still providing high performance for today's electronic devices.

SUMMARY OF THE INVENTION

An embodiment of the present invention includes a trench capacitor having a trench formed in a semiconductor substrate, wherein the trench is substantially cylindrical. Another embodiment of the present invention includes a method of forming a trench capacitor in a semiconductor substrate. The method includes forming a dopant profile that is monotonically increasing in dopant concentration level as a function of depth into the substrate; and performing a dopant sensitive etch, such that a cylindrosymmetric trench shape is formed.

Still another embodiment of the present invention includes a method of forming a trench capacitor in a semiconductor substrate. The method includes forming a dopant profile that is monotonically increasing in dopant concentration level as a function of depth into the substrate by performing in situ doping of an epitaxial layer; and performing a dopant sensitive etch, via a reactive ion etch process, and etching a cylindrosymmetric trench, the trench having a depth ranging from about 1 micrometer to about 8 micrometers.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Block diagrams may not illustrate certain connections that are not critical to the implementation or operation of the present invention, for illustrative clarity.

Figure 1:
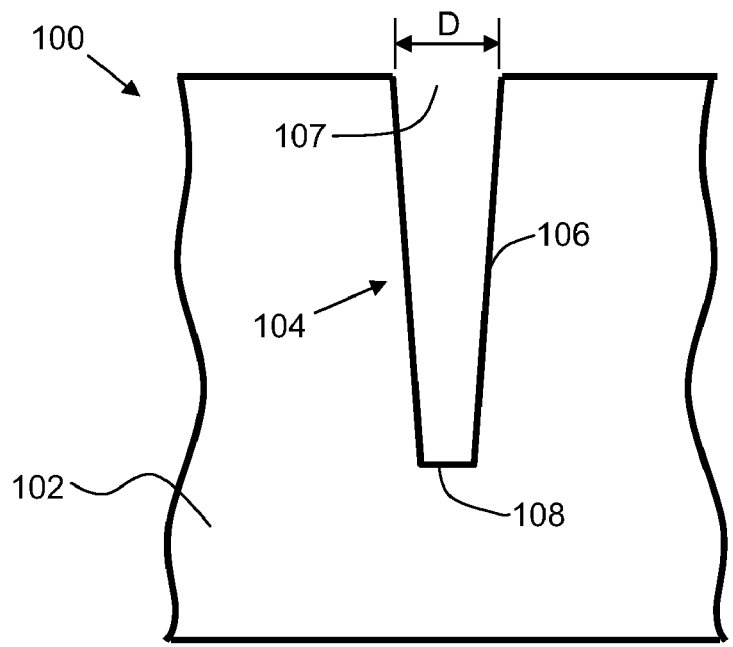

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGs) of the drawing, in which case typically the last two significant digits may be the same, the most significant digit being the number of the drawing figure (FIG).

FIG. 1 shows a prior art trench structure.

Figure 2:
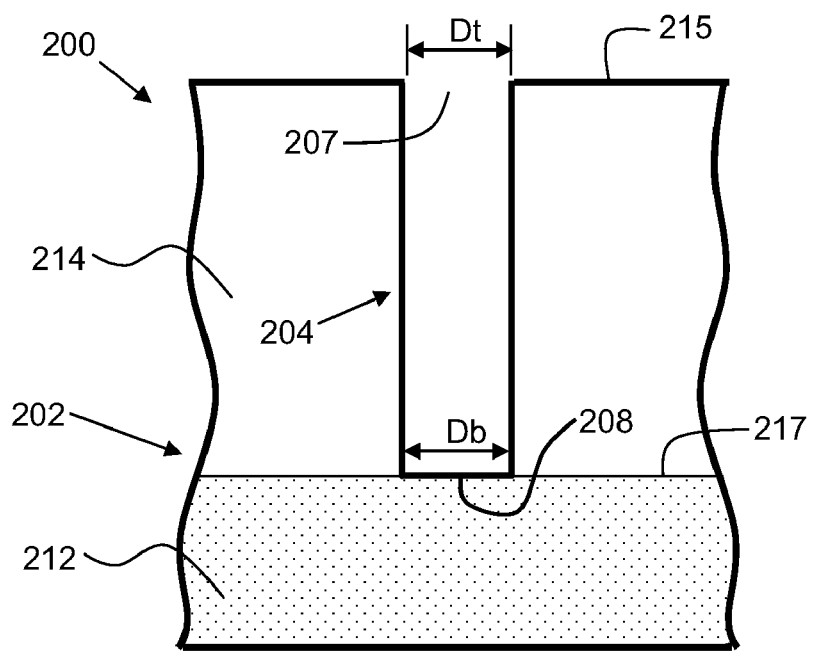

FIG. 2 shows a trench structure in accordance with an embodiment of the present invention.

Figure 3:
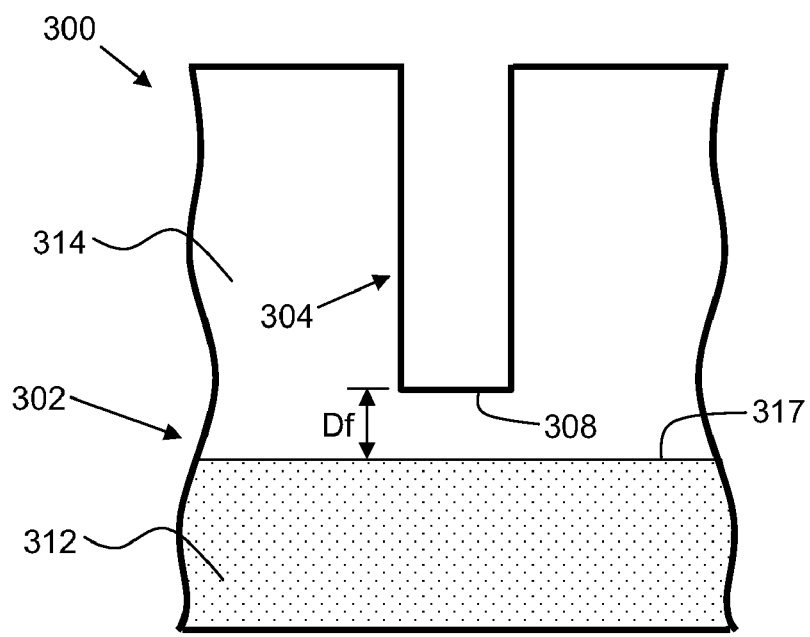

FIG. 3 shows a trench structure in accordance with another embodiment of the present invention.

Figure 4A:
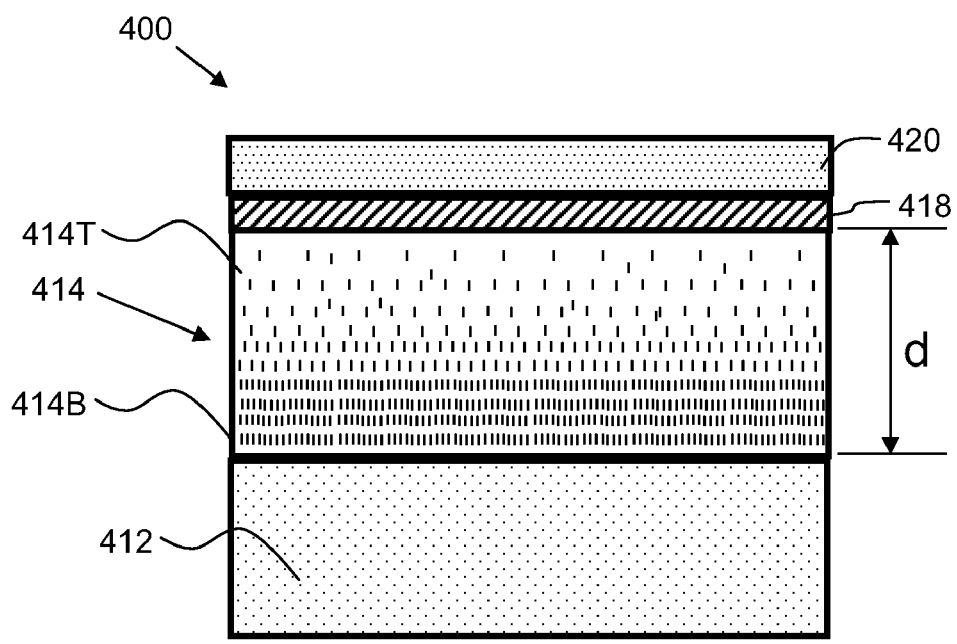

FIG. 4A shows a semiconductor structure prior to etching.

Figure 4B:
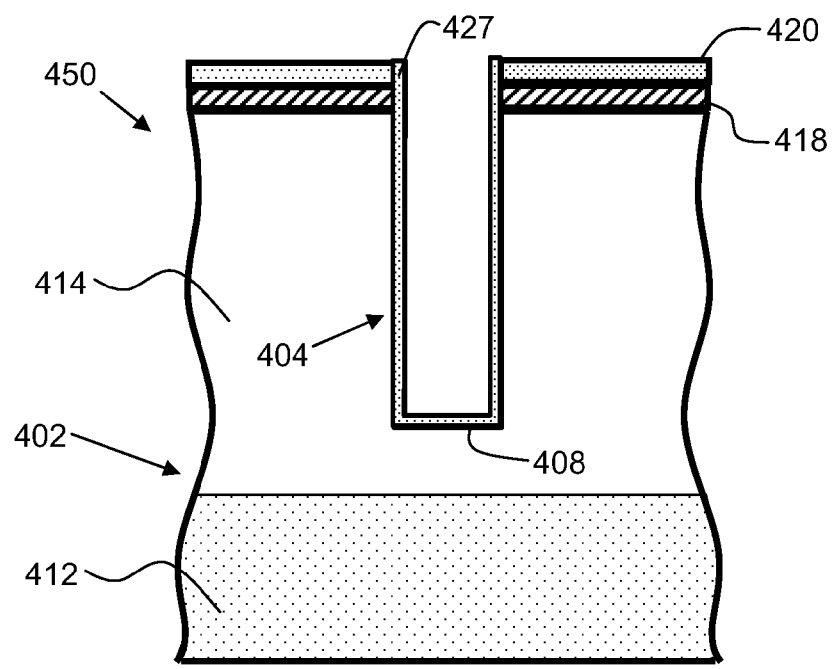
Figure 4C:
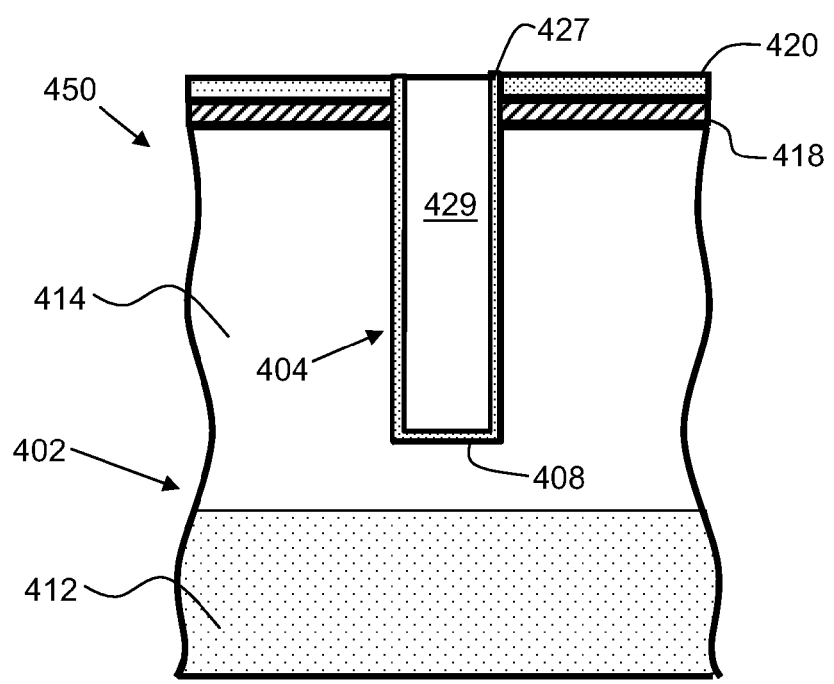

FIGS. 4B-4C show a trench structure in accordance with another embodiment of the present invention.

Figure 5:
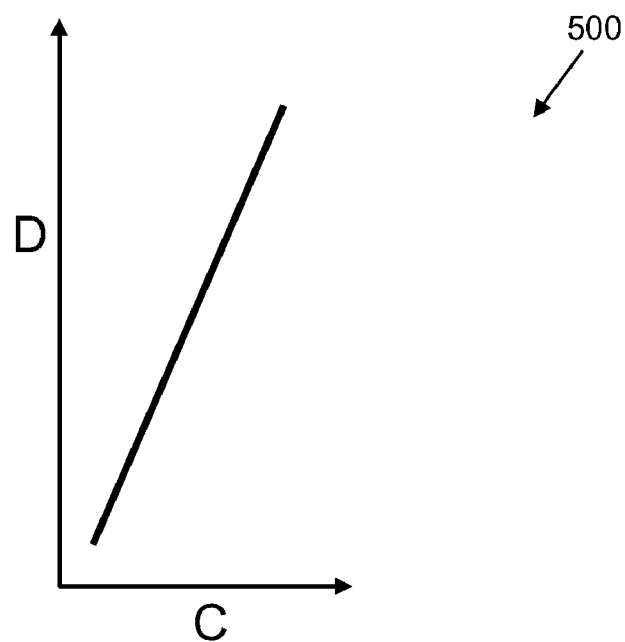
Figure 6:
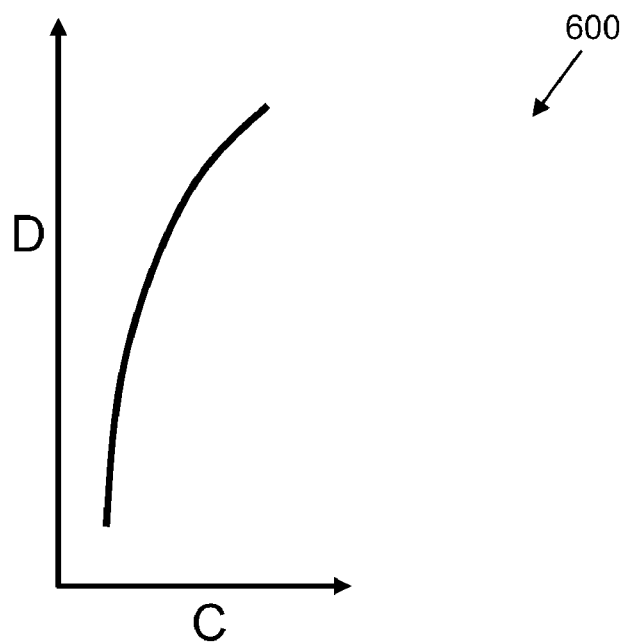

FIGS. 5 and 6 are graphs showing dopant profiles.

Figure 7:
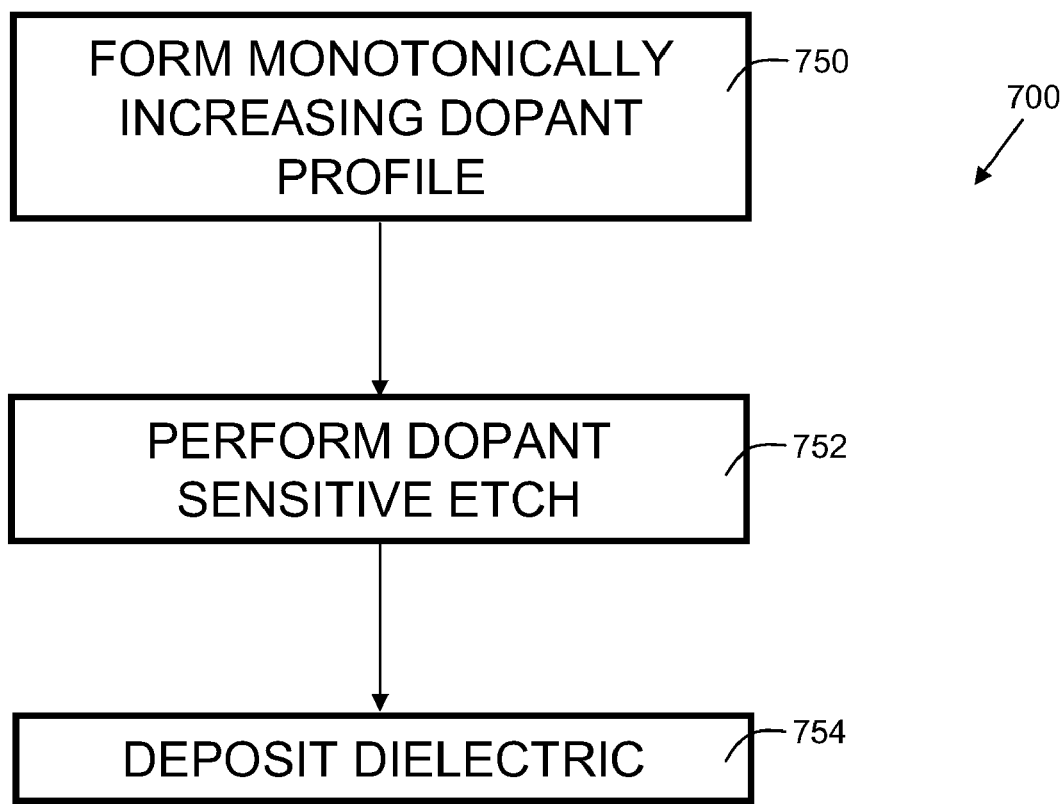

FIG. 7 is a flowchart indicating process steps for performing a method in accordance with an embodiment of the present invention.

DETAILED DESCRIPTION

FIG. 1 shows a prior art trench structure 100. Trench 104 is formed in silicon substrate 102. In practice, trench 104 is of a truncated cone shape, where the width D of trench opening 107 is greater than the width of trench floor 108.

FIG. 2 shows a trench structure 200 in accordance with an embodiment of the present invention. Trench 204 differs from trench 104 in that trench 204 is substantially cylindrical (cylindrosymmetric). The advantage of trench 204 is that the surface area is increased over the truncated cone trench 104 of FIG. 1. As trench surface area is a function of capacitance, it is desirable to increase capacitance of trench capacitors, and yet still important to minimize the amount of space required for the overall structure, for the purposes of circuit density.

For trench 204, the width Dt of the trench opening 207 is substantially equal to the width Db of the trench bottom 208. In one embodiment, the depth of trench 204 ranges from about 1 micrometers to about 8 micrometers, typically from about 3 micrometers to about 5 micrometers. In the case of a trench 4 micrometers deep, and having a trench diameter at the top of 90 nanometers (nm), a cylindrosymmetric shape can result in up to 50% more capacitance as compared with the truncated cone shape of the prior art. The trench diameter Dt may range from about 30 nm to about 300 nm, and more preferably, from about 50 nm to about 120 nm. In the ideal ease, Dt=Db. However, according to the present invention, if Db is at least 90% of Dt, there is considerable improvement over a cone-shaped trench. For example, if Dt=80 nanometers, and Db=75 nanometers, then Db is greater than 90% of Dt, and hence, the trench shape is cylindrosymmetric.

Trench 204 is formed in substrate 202, which is comprised of a p-type portion 212, and a n-type portion 214. The semiconductor material of the n-type portion 214 can be selected from, but is not limited to, silicon, germanium, silicon-germanium alloy, silicon-carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

While particular n- and p-type doping are described herein according to N-type metal oxide semiconductor (NMOS)

technology, it is to be appreciated that one or more aspects of the embodiments of the present invention are equally applicable to forming a PMOS (generally, simply by reversing the n- and p-type doping).

The area where trench 204 is formed is first doped with a monotonically increasing dopant profile or other suitable doping profile based on a certain technology and process requirement, where the dopant concentration is lowest at the top 215 of the n-type portion 214, and the dopant concentration is highest at the bottom 217 of the n-type portion 214.

The doping concentration at its lowest ranges from about $5.0 \times 10^{14}/cm^3$ to about $5.0 \times 10^{21}/cm^3$, and more preferably from about $5.0 \times 10^{16}/cm^3$ to about $5.0 \times 10^{20}/cm^3$, although lesser and greater dopant concentrations can also be employed. The doping concentration at the highest level ranges from about $5.0 \times 10^{18}/cm^3$ to about $5.0 \times 10^{22}/cm^3$, and more preferably from about $5.0 \times 10^{19}/cm^3$ to about $5.0 \times 10^{20}/cm^3$, although lesser and greater dopant concentrations can also be employed.

A dopant-sensitive etch process is then used to etch the trench. In one embodiment, a reactive ion etch (RIE) process is used. The etch rate is related to dopant concentration, and hence, a faster etch rate is achieved near the trench bottom as compared with the trench top. The dopant concentration and profile and etch parameters are configured so as to form a substantially cylindrosymmetric shape upon completion of the etching of the trench structure 204.

The n-type layer within which DTs are formed could be also fabricated by epitaxy technology with in situ doping, with dopants such as Arsenic or Phosphorus for n-type doping. Boron or BF2 may be used for p-type doping in silicon.

FIG. 3 shows a trench structure 300 in accordance with another embodiment of the present invention. In this embodiment, the trench floor 308 is at a distance Df above the bottom 317 of the n-type portion 314. It is not necessary for the trench to be etched all the way to the bottom of the n-type portion 314.

FIG. 4A shows a semiconductor structure 400 prior to etching. In this embodiment, the dopant profile is achieved by epitaxy with in situ doping to form epitaxial layer 414. This technique is well suited to creating the monotonically increasing dopant profile in epitaxial layer 414, with the highest concentration at the bottom 414B of the epitaxial layer, and where the concentration decreases as a function of depth, with the lowest concentration at the top 414T of the epitaxial layer. The etching rate is faster with a higher dopant concentration. Since the higher dopant concentration is at the bottom of the epitaxial layer, where it is exposed to the least amount of etch time, it etches about the same amount as the topmost portion of the epitaxial layer, which is exposed to the most amount of etch time, yet with the highest rate, hence a cylindrosymmetrical shape can be achieved. In the ideal case, the amount of material etched M is a function of etch rate Er and etch time Et:

$$M = Er \times Et$$

The etch rate is a function of dopant concentration C, and the dopant concentration C is a function of depth d. Therefore, the etch rate is a function of depth, and can be written as Er(d). Conversely, the etch time varies inversely as a function of depth d and can be written as Et(d). The amount of material etched at a given depth d, M(d) is therefore:

$$M(d) = Er(d) \times Et(d)$$

To form a cylindrosymmetrical shape, the dopant concentration is such the M(d) is the same for all values of d, where d is the depth of the epitaxial layer 414. In one embodiment, the depth of the epitaxial layer 414 is in the range of about 2 micrometers to about 6 micrometers.

Various etch parameters can then be adjusted, such as etch time, chuck temperature and process pressure, to achieve the cylindrosymmetric shape of the desired depth.

A buried oxide layer 418 and SOI (silicon-on-insulator) layer 420 are then disposed on top of the epitaxial layer 414 prior to etching.

FIG. 4B shows a trench structure 450 in accordance with an embodiment of the present invention. Trench structure 450 is similar to trench structure 300, but further comprises buried oxide layer 418 and SOI (silicon-on-insulator) layer 420. The thickness of buried oxide layer 418 preferably ranges from about 50 nanometers (nm) to about 500 nm, and more preferably from about 100 nm to about 300 nm. The thickness of SOI layer 420 preferably ranges from about 1 nm to about 300 nm, and more preferably from about 10 nm to about 100 nm. High-K dielectric layer 427 is deposited on the interior of the trench.

The dielectric material used for dielectric 427 may include, but is not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, and any combination of these materials.

The dielectric layer 427 can be formed, for example, by thermal oxidation, chemical oxidation, thermal nitridation, atomic layer deposition (ALD), chemical vapor deposition (CVD), low-pressure chemical vapor deposition (LPCVD), and/or any other suitable methods. In one embodiment, dielectric layer 427 ranges in thickness from about 20 angstroms to about 200 angstroms, and more preferably from about 30 angstroms to about 100 angstroms.

There have been previous attempts to increase trench surface area by using a roughening agent, or some other means to create a "corrugated" inner surface of the trench. However, these prior art devices suffer some serious drawbacks. Fabrication costs and times are increased due to the extra processing steps required for corrugation of the inner trench surface. Reliability and device yield may also suffer, as the repeatability of deposition of high-K dielectric materials and other layers inside a trench with corrugated walls may have higher levels of variability from device to device than the relatively smooth trench walls of embodiments of the present invention.

FIG. 4C shows the trench structure 450 after subsequent process steps. Following deposition of dielectric film 427 in the trench, at least one conductive material 429 is deposited or filled in as the inter electrode, that can include a metallic material and/or a doped semiconductor material. Each of the at least one fill material can be deposited, for example, by low pressure chemical vapor deposition (LPCVD) or atomic layer deposition (ALD). The metallic material can include at least one of Ta, Ti, W, CoWP, TaN, TiN, and WN. The doped semiconductor material can include doped polysilicon, germanium, a silicon germanium alloy, and/or any doped compound semiconductor material.

FIGS. 5 and 6 are graphs showing dopant profiles. FIG. 5 shows a graph 500 depicting a linear dopant profile. The vertical axis of graph 500 (labeled "D") represents depth, with higher positions along the vertical axis representing a deeper depth into a trench. The horizontal axis (labeled "C") represents concentration, with increasing concentration as the position along the horizontal axis moves rightward. This graph shows that the dopant concentration increases as a function of the depth into the n type substrate (212 of FIG. 2).

FIG. 6 shows a graph 600 depicting a non-linear dopant profile. In one embodiment, the non-linear dopant profile is exponential. Both graph 500 and graph 600 show non-uniform, monotonically increasing dopant profiles, meaning that the dopant concentration increases as depth increases.

In one embodiment, the dopant used is arsenic. In another embodiment, the dopant used is phosphorus. The dopant concentration ranges from about 10e15 atoms/cm3 to about 10e21 atoms/cm3. More preferably, the dopant concentration ranges from about 10e18 atoms/cm3 to about 10e20 atoms/cm3. While particular n- and p-type dopants are described herein according to n type technology, it is to be appreciated that one or more aspects of the present invention are equally applicable to p type technology (generally, simply by reversing the n- and p-type dopants). In the case of a p-type monotonically increasing dopant concentration, boron is used in one embodiment.

In one embodiment, the monotonically increasing dopant concentration profile is achieved via epitaxial growth, where the n-type portion 214 (FIG. 2) is grown from the bottom up. In another embodiment, the dopant profile is achieved via ion implantation, from the top down.

FIG. 7 is a flowchart indicating process steps for performing a method in accordance with an embodiment of the present invention. In process step 750, a monotonically increasing dopant profile is formed. In process step 752, a dopant sensitive etch is performed. This may be performed via an RIE process. In process step 754, a dielectric layer is deposited. This may be performed via an ALD process.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A trench capacitor comprising:
a trench formed in a semiconductor substrate, wherein the semiconductor susbtrate comprises a monotonically increasing dopant profile that comprises a dopant concentration that is lowest at a top region of the semiconductor susbtrate and wherein the dopant concentration is highest at a bottom region of the semiconductor substrate, wherein the trench is substantially cylindrical.

2. The trench of claim 1, wherein the trench depth ranges from about 1 micrometers to about 8 micrometers.

3. The trench of claim 1, wherein the trench diameter is between about 40 nanometers and about 100 nanometers.

4. The trench of claim 1, wherein the width of the trench at the bottom is at least 90 percent of the width at the top.

5. The trench capacitor of claim 1, wherein the semiconductor substrate comprises a first layer of n type silicon disposed over a second layer of p type silicon, and wherein the trench depth is less than the depth of the first layer.

6. The trench capacitor of claim 5, further comprising a buried oxide layer disposed on the first layer of n type silicon, and a silicon layer disposed on the buried oxide layer.

7. The trench capacitor of claim 4, further comprising a high-K dielectric layer, the layer ranging in thickness from about 70 angstroms to about 100 angstroms.

8. The trench capacitor of claim 7, wherein the high-K dielectric layer is comprised of a material selected from the group consisting of hafnium oxide, hafnium silicate, and zirconium oxide.

9. A method of forming a trench capacitor in a semiconductor substrate, comprising:
forming a dopant profile that is monotonically increasing in dopant concentration level as a function of depth into the substrate; and
performing a dopant sensitive etch, such that a cylindrosymmetric trench shape is formed.

10. The method of claim 9, wherein the dopant concentration level increases linearly as a function of depth into the substrate.

11. The method of claim 9, wherein the dopant concentration level increases exponentially as a function of depth into the substrate.

12. The method of claim 9, wherein the dopant concentration level ranges from about 10e14 atoms per cubic centimeter to about 10e22 atoms per cubic centimeter.

13. The method of claim 12, wherein the dopant concentration level ranges from about 10e18 atoms per cubic centimeter to about 10e20 atoms per cubic centimeter.

14. The method of claim 12, including selecting the dopant from the group consisting of arsenic and phosphorus.

15. The method of claim 12, wherein the dopant is boron.

16. The method of claim 9, wherein the performing of a dopant sensitive etch is with a reactive ion etch.

17. The method of claim 9, further comprising depositing a high-K dielectric layer on the interior surface of the trench.

18. The method of claim 17, wherein the depositing a high-K dielectric layer on the interior surface of the trench comprises depositing a layer ranging in thickness from about 70 nanometers to about 100 nanometers.

19. The method of claim 17, wherein the depositing a high-K dielectric layer on the interior surface of the trench comprises depositing a layer comprising a material selected from the group consisting of hafnium oxide, hafnium silicate, and zirconium oxide.

20. A method of forming a trench capacitor in a semiconductor substrate, comprising:
forming a dopant profile that is monotonically increasing in dopant concentration level as a function of depth into the substrate by performing in situ doping of an epitaxial layer; and
performing a dopant sensitive etch, via a reactive ion etch process, and etching a cylindrosymmetric trench, the trench having a depth ranging from about 1 micrometer to about 8 micrometers.

* * * * *